United States Patent
Komuro et al.

(10) Patent No.: US 12,094,882 B2
(45) Date of Patent: Sep. 17, 2024

(54) SEMICONDUCTOR INTEGRATED CIRCUIT DEVICE

(71) Applicant: Socionext Inc., Kanagawa (JP)

(72) Inventors: Hideyuki Komuro, Yokohama (JP); Toshio Hino, Yokohama (JP); Tomoya Tsuruta, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 389 days.

(21) Appl. No.: 17/719,052

(22) Filed: Apr. 12, 2022

(65) Prior Publication Data

US 2022/0336499 A1    Oct. 20, 2022

Related U.S. Application Data

(63) Continuation of application No. PCT/JP2020/038192, filed on Oct. 8, 2020.

(30) Foreign Application Priority Data

Oct. 18, 2019  (JP) .................................. 2019-191372

(51) Int. Cl.
   *H01L 27/118*   (2006.01)
(52) U.S. Cl.
   CPC ............... *H01L 27/11807* (2013.01); *H01L 2027/11881* (2013.01)

(58) Field of Classification Search
   None
   See application file for complete search history.

(56) References Cited

U.S. PATENT DOCUMENTS

| 2018/0151494 A1 | 5/2018 | Ohtou et al. |
| 2019/0080969 A1 | 3/2019 | Tsao |
| 2019/0288004 A1 | 9/2019 | Smith et al. |

OTHER PUBLICATIONS

International Search Report (ISR) dated Dec. 28, 2020 issued in International Patent Application No. PCT/JP2020/038192, with English translation.

*Primary Examiner* — Anthony Ho
(74) *Attorney, Agent, or Firm* — Rimon P.C.

(57) ABSTRACT

In a power line structure for supplying power to standard cells, buried power lines extending in the X direction are placed at a given spacing in the Y direction. A local power line extending in the Y direction is connected with the buried power lines. Metal power lines extending in the X direction are formed in an upper-layer metal interconnect layer and connected with the local power line. The spacing of placement of the metal power lines in the Y direction is greater than the spacing of placement of the buried power lines.

14 Claims, 15 Drawing Sheets

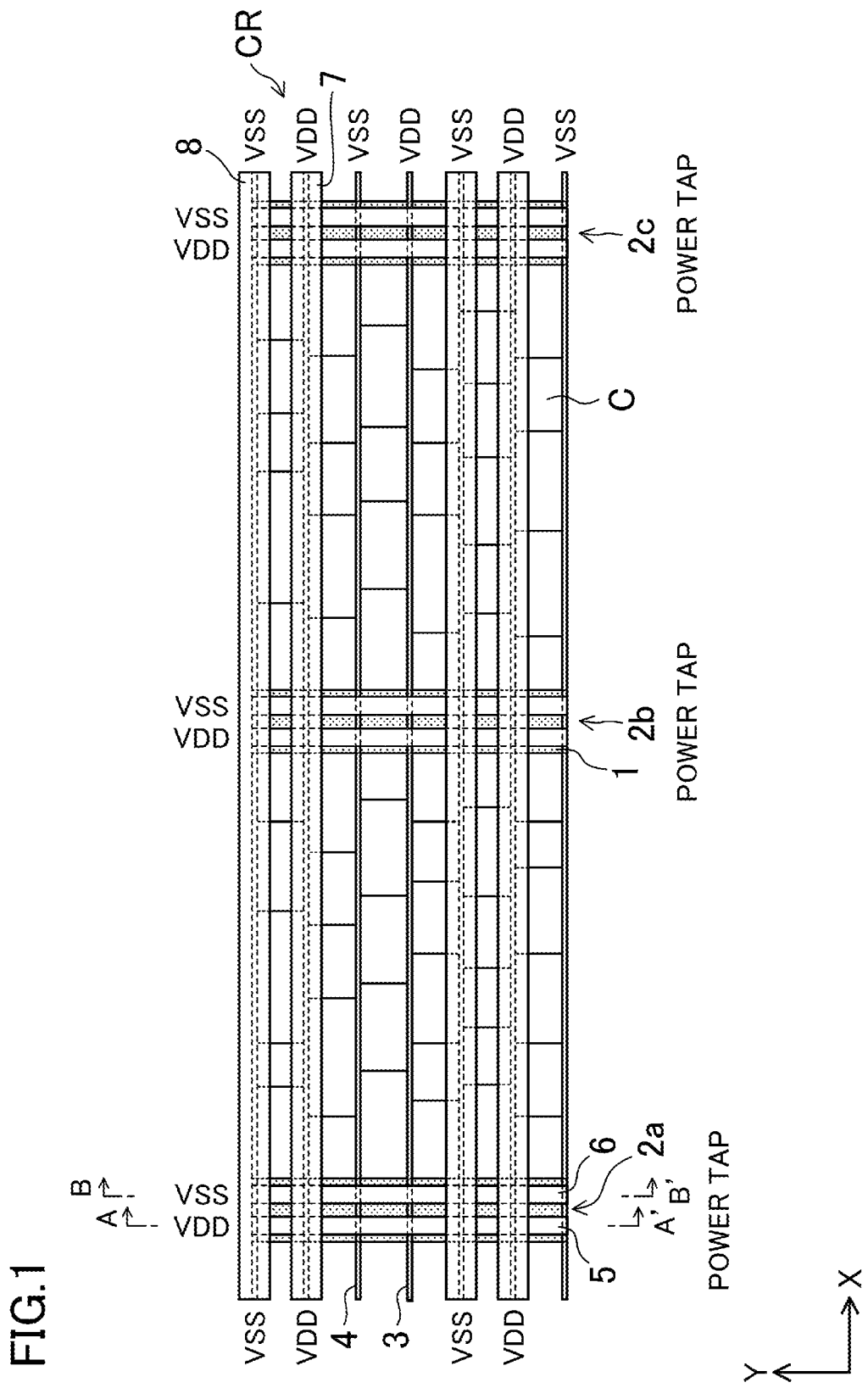

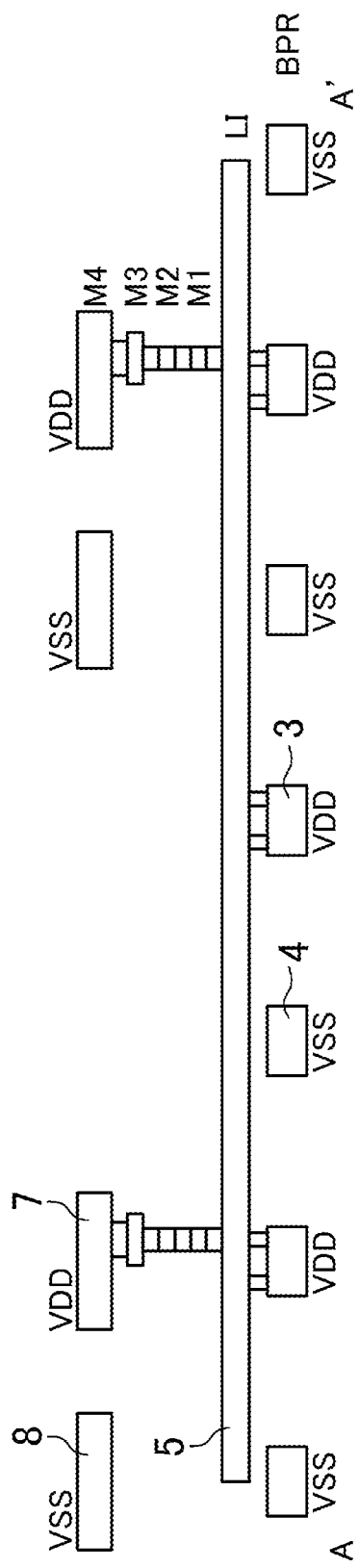
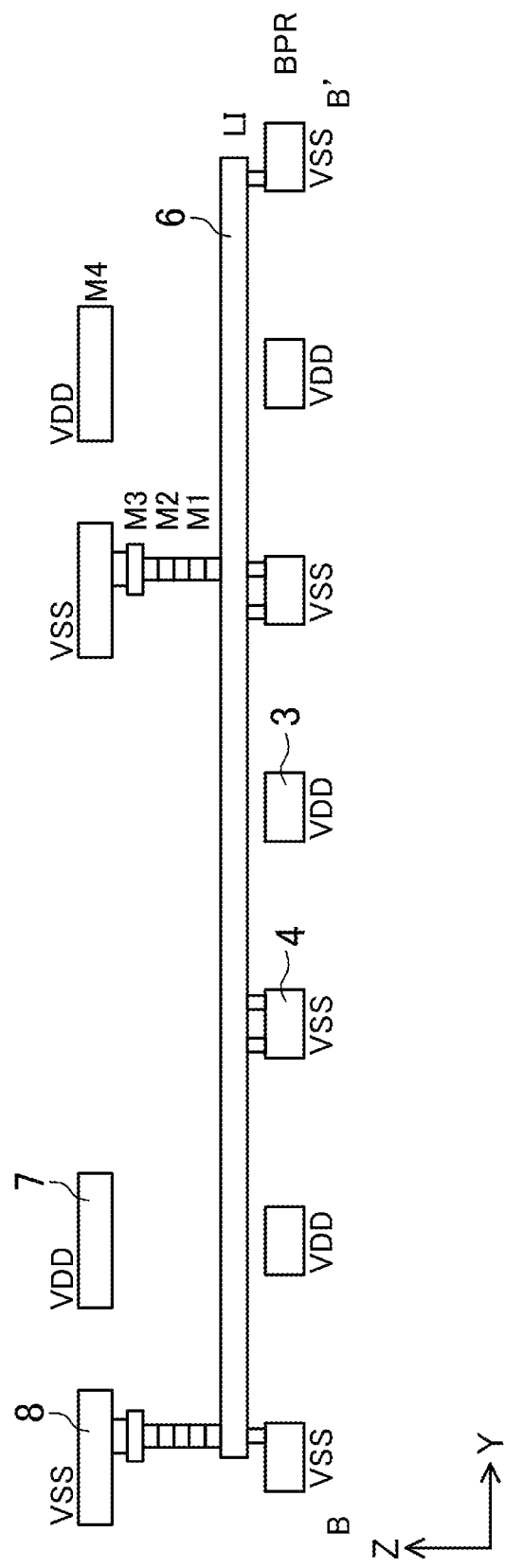

FIG.3
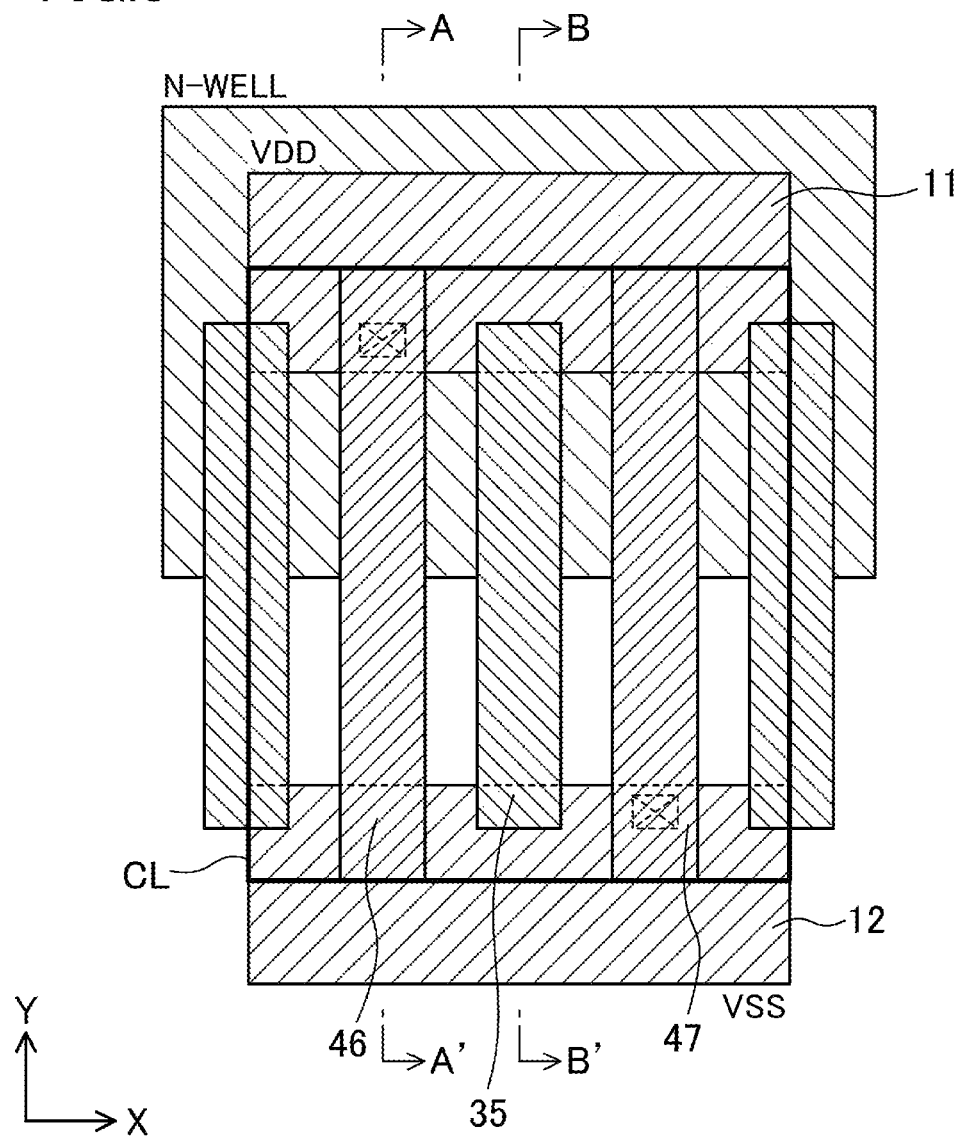
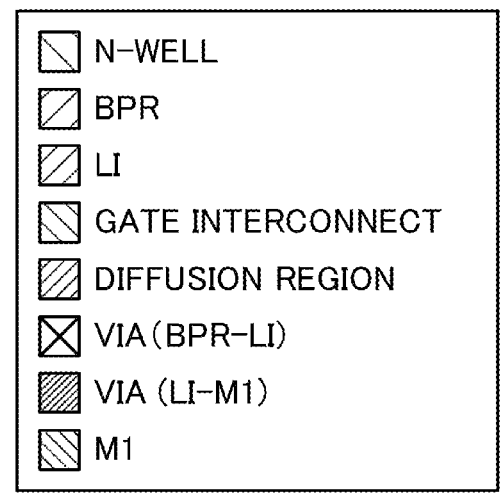

FIG.4A
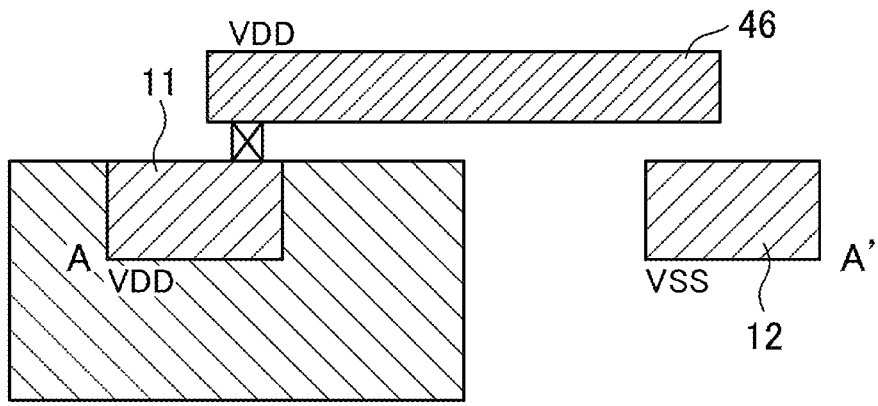
FIG.4B
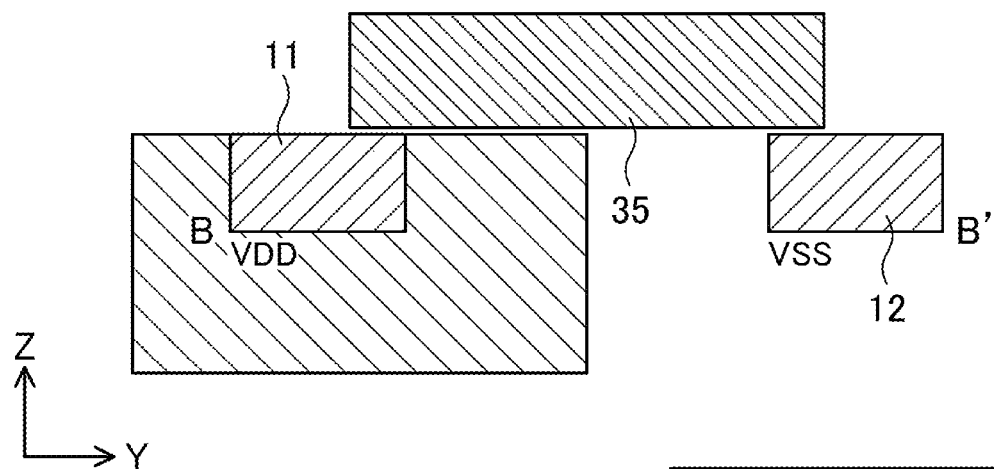
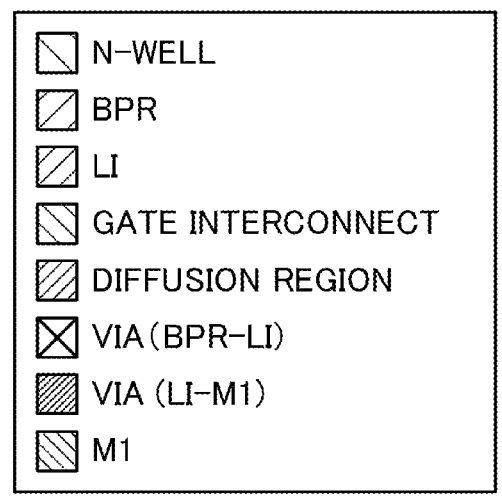

FIG.6A
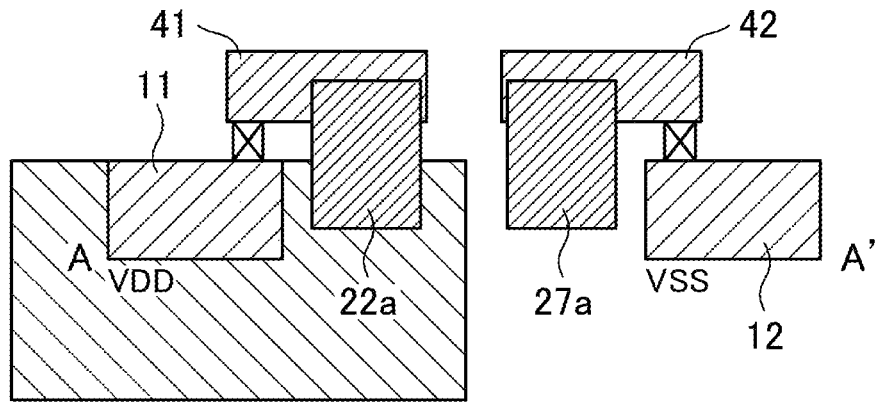
FIG.6B
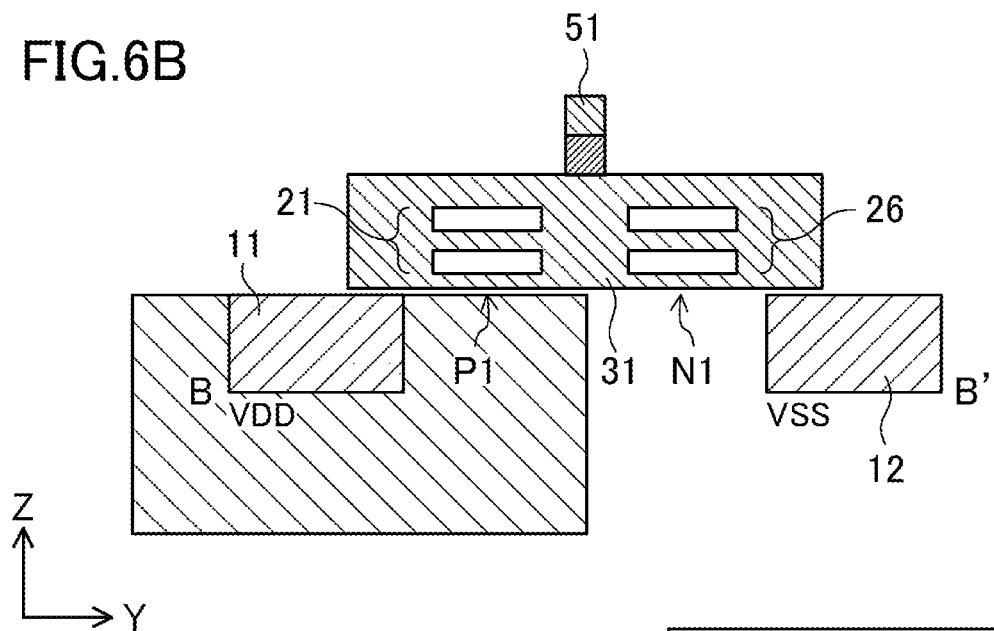
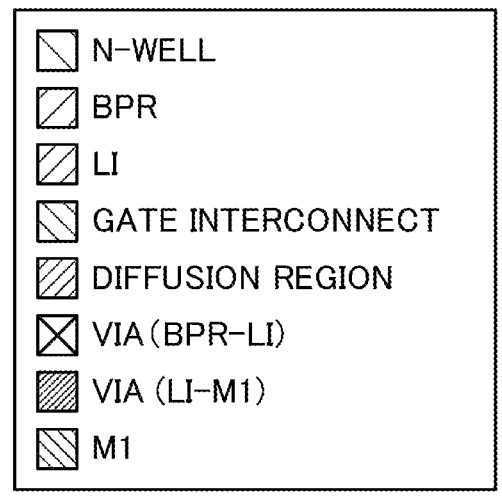

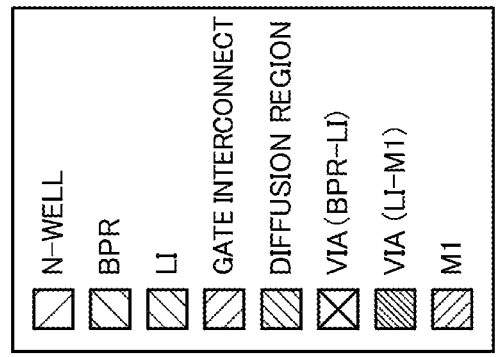
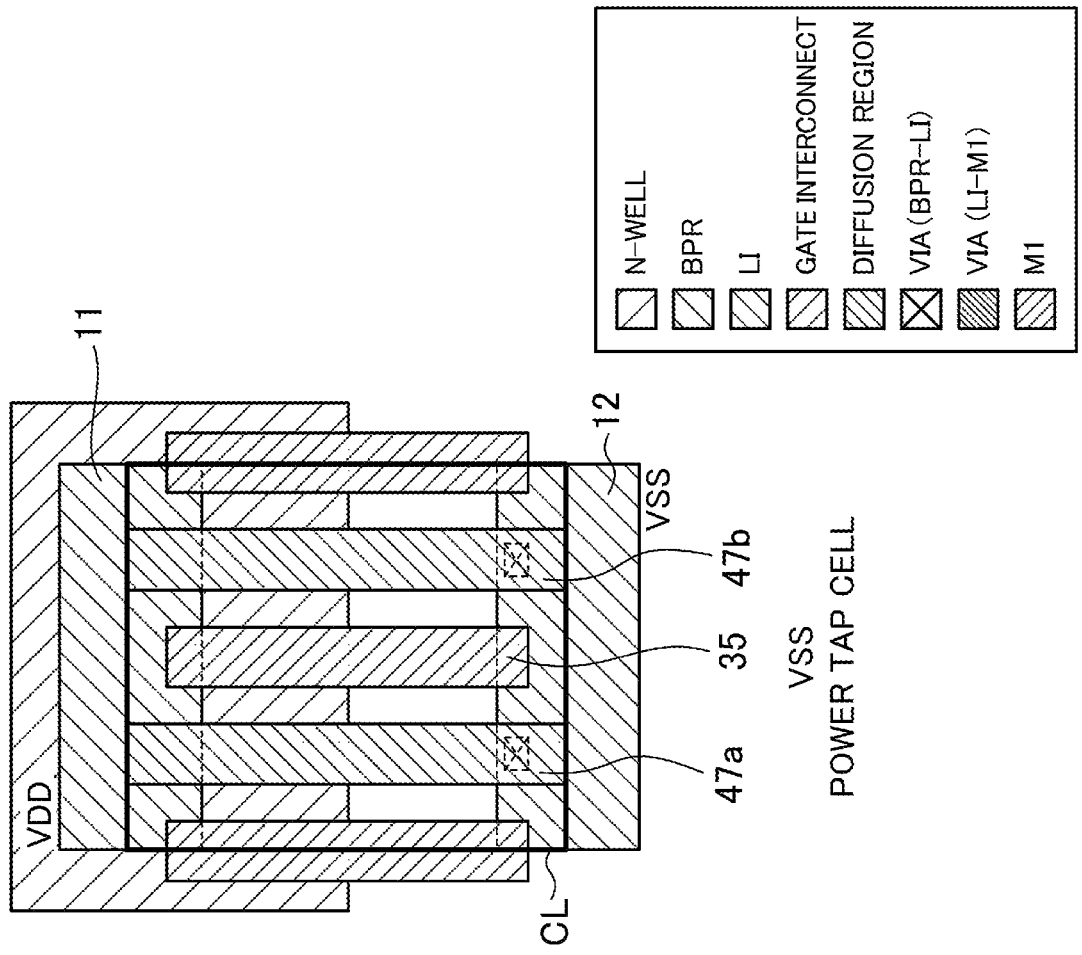
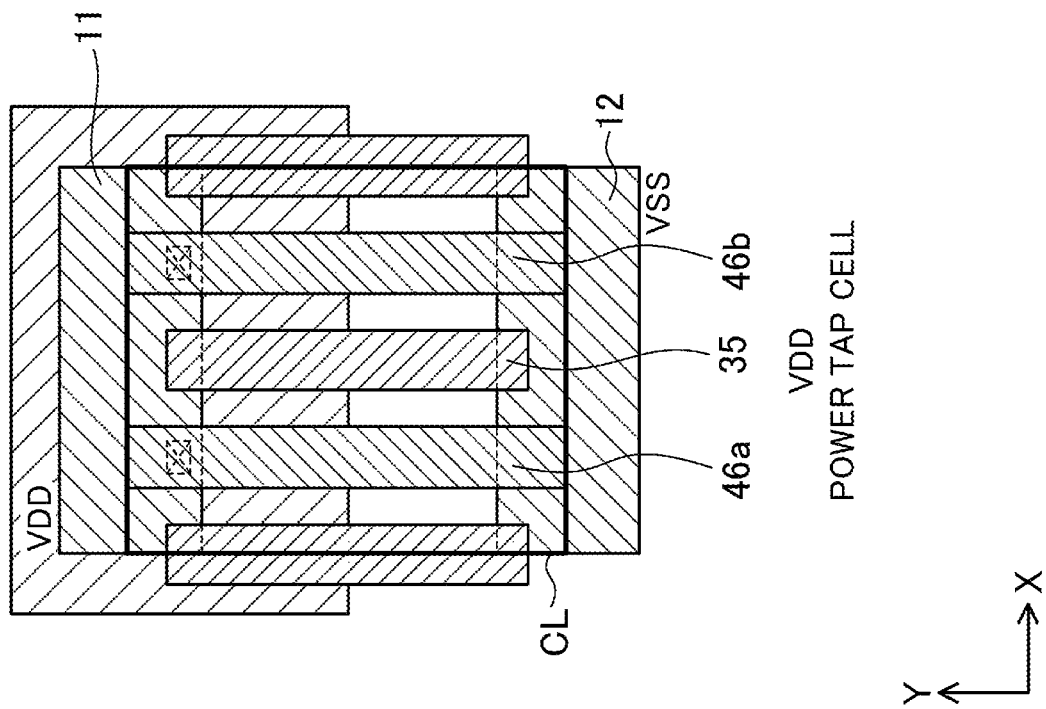

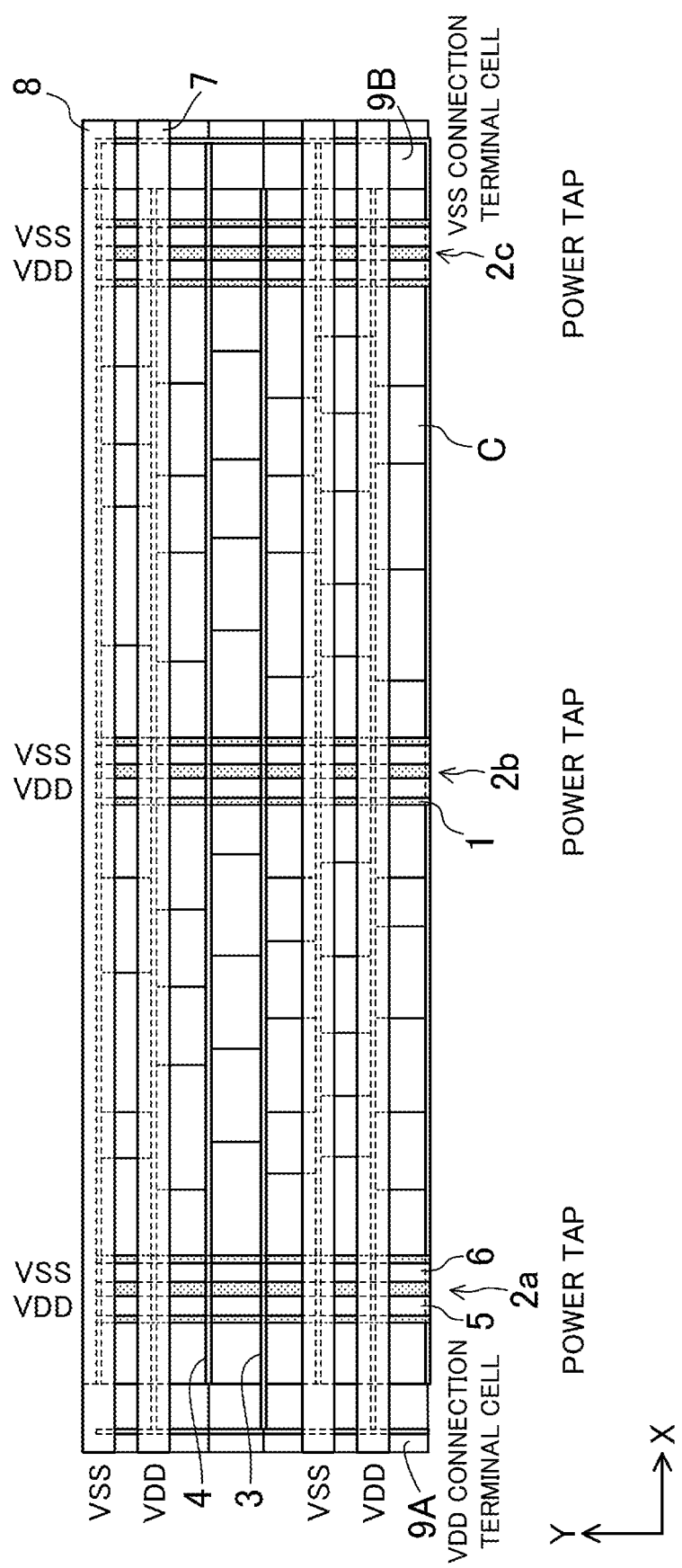

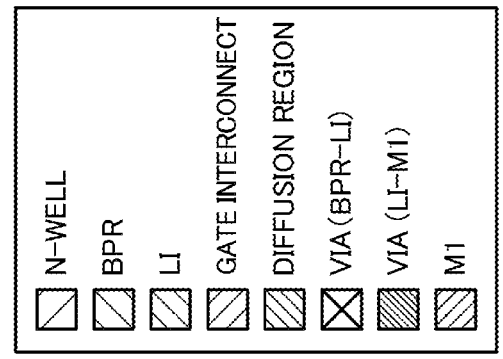
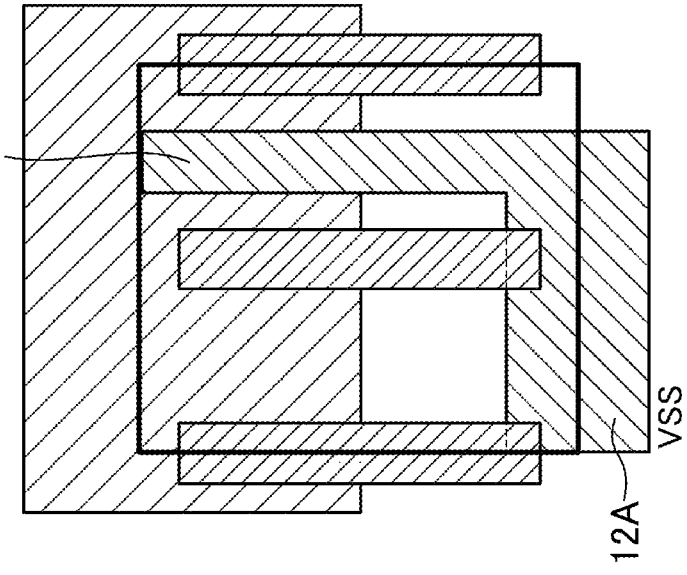
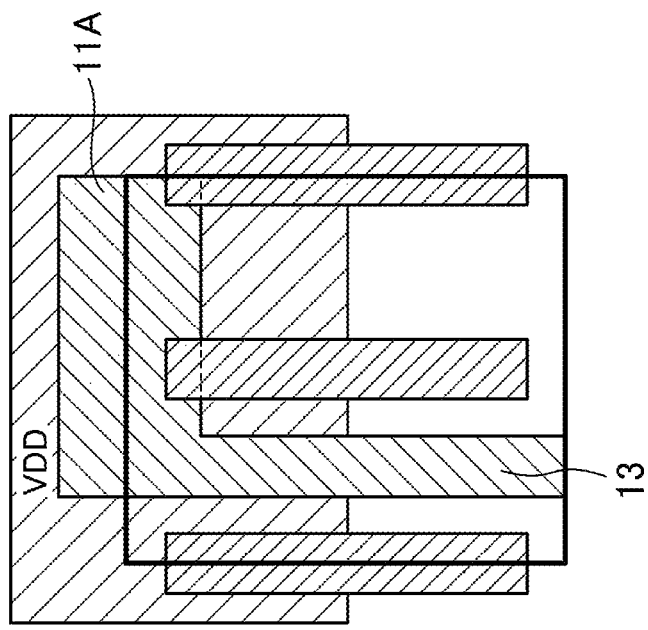
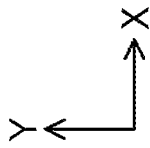
(a) VDD CONNECTION TERMINAL CELL
(b) VSS CONNECTION TERMINAL CELL

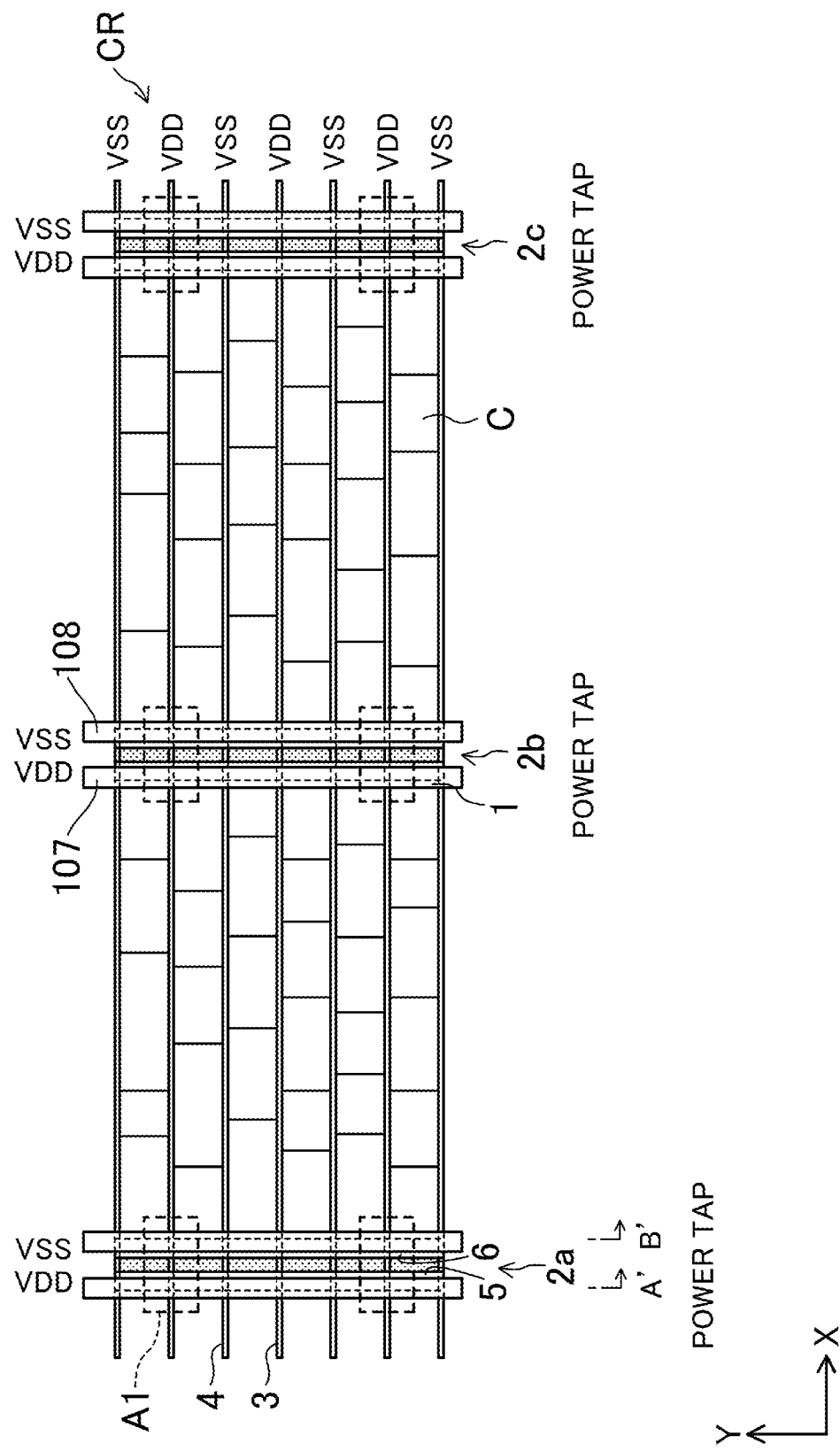

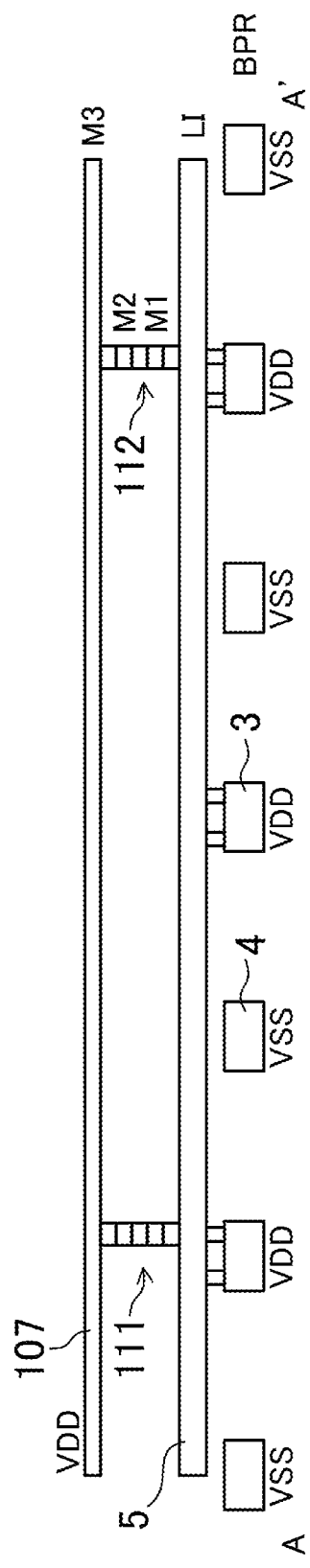
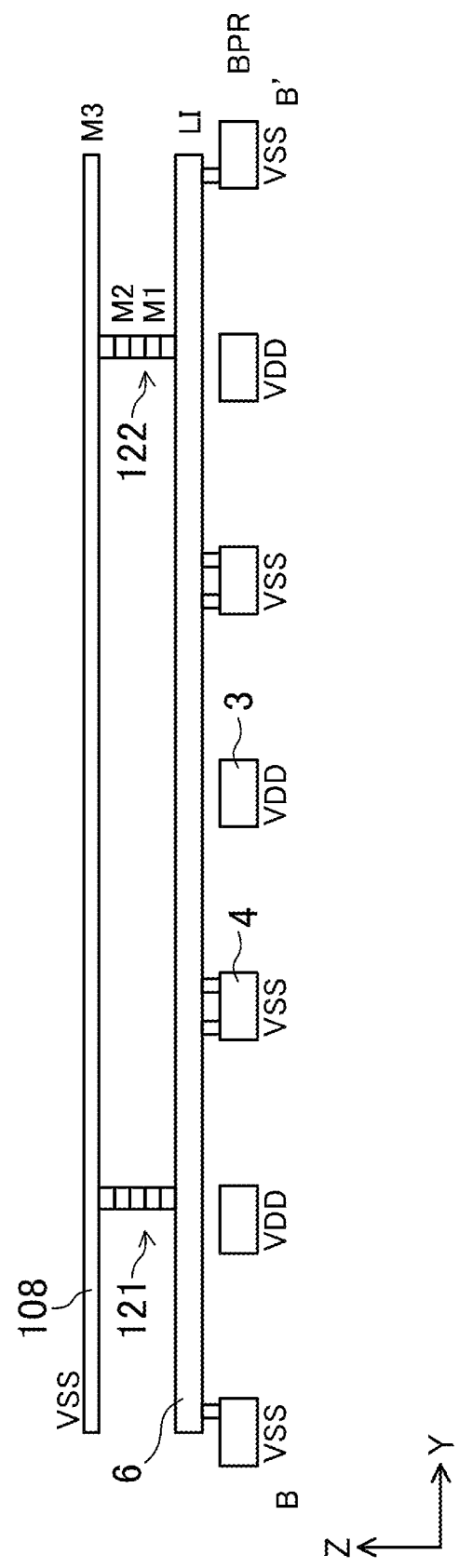

SEMICONDUCTOR INTEGRATED CIRCUIT DEVICE

CROSS-REFERENCE TO RELATED APPLICATIONS

This is a continuation of International Application No. PCT/JP2020/038192 filed on Oct. 8, 2020, which claims priority to Japanese Patent Application No. 2019-191372 filed on Oct. 18, 2019. The entire disclosures of these applications are incorporated by reference herein.

BACKGROUND

The present disclosure relates to a semiconductor integrated circuit device provided with standard cells.

As a method for forming a semiconductor integrated circuit on a semiconductor substrate, a standard cell method is known. The standard cell method is a method in which basic units (e.g., inverters, latches, flipflops, and full adders) having specific logical functions are prepared in advance as standard cells, and a plurality of such standard cells are placed on a semiconductor substrate and connected through interconnects, thereby designing an LSI chip.

Also, for higher integration of a semiconductor integrated circuit device, proposed is use of buried power rails (BPRs) that are power lines laid in a buried interconnect layer, not conventional power lines laid in a metal interconnect layer formed above transistors, in standard cells.

U.S. Patent Application No. 2019/0080969 (FIG. 1E) discloses a structure of a block of standard cells using buried power rails, which are connected to sources of transistors and further connected to power lines laid in an upper interconnect layer.

In the configuration of the cited patent document, while buried power rails are used as power lines for standard cells, it is necessary to provide power lines in an upper interconnect layer for the individual buried power rails. This reduces the region for laying signal lines in the upper interconnect layer, resulting in hindering higher integration of a semiconductor integrated circuit device.

An objective of the present disclosure is achieving higher integration and area reduction of a semiconductor integrated circuit device by securing the region for laying signal lines in the power line structure for supplying power to standard cells.

SUMMARY

According to the first mode of the present disclosure, a semiconductor integrated circuit device includes: a plurality of cell rows each including standard cells arranged in a first direction, the cell rows being arranged in a second direction vertical to the first direction; a plurality of buried power lines formed in a buried interconnect layer, extending in the first direction, placed at a first given spacing in the second direction, and supplying a first power supply voltage to the standard cells; a local power line formed in a local interconnect layer in which local interconnects in contact with sources and drains of transistors included in the standard cells are formed, extending in the second direction, and connected with the plurality of buried power lines; and a plurality of metal power lines formed in a metal interconnect layer located above the local interconnect layer, extending in the first direction, placed at a second given spacing greater than the first given spacing in the second direction, and connected with the local power line.

According to the above mode, a plurality of buried power lines extending in the first direction are placed at a given spacing in the second direction. A local power line extending in the second direction is connected with the plurality of buried power lines. A plurality of metal power lines extending in the first direction are formed in a metal interconnect layer located above the local interconnect layer, and connected with the local power line. This configuration eliminates the necessity of providing metal interconnects for the individual buried power lines, and the plurality of metal power lines are placed at a spacing greater than the spacing of placement of the plurality of buried power lines in the second direction. In the metal interconnect layer, therefore, a larger region can be secured for laying signal lines. As a result, reduction in the area of the semiconductor integrated circuit device can be achieved.

According to the second mode of the present disclosure, a semiconductor integrated circuit device includes: a plurality of cell rows each including standard cells arranged in a first direction, the cell rows being arranged in a second direction vertical to the first direction; a plurality of buried power lines formed in a buried interconnect layer, extending in the first direction, placed at a first given spacing in the second direction, and supplying a first power supply voltage to the standard cells; a local power line formed in a local interconnect layer in which local interconnects in contact with sources and drains of transistors included in the standard cells are formed, extending in the second direction, and connected with the plurality of buried power lines; and a metal power line formed in a metal interconnect layer located above the local interconnect layer, extending in the second direction, and overlapping the local power line as viewed in plan, wherein the local power line and the metal power line are mutually connected by a plurality of connecting portions provided at a second given spacing greater than the first given spacing in the second direction.

According to the above mode, a plurality of buried power lines extending in the first direction are placed at a given spacing in the second direction. A local power line extending in the second direction is connected with the plurality of buried power lines. A metal power line extending in the second direction is formed in a metal interconnect layer located above the local interconnect layer, and connected with the local power line by a plurality of connecting portions placed at a given spacing in the second direction. This configuration eliminates the necessity of providing metal interconnects for the individual buried power lines, and the metal power line is connected with the local power line by the plurality of connecting portions placed at a spacing greater than the spacing of placement of the plurality of buried power lines in the second direction. In the metal interconnect layer, therefore, a larger region can be secured for laying signal lines. As a result, reduction in the area of the semiconductor integrated circuit device can be achieved.

According to the third mode of the present disclosure, a semiconductor integrated circuit device includes: a plurality of cell rows each including standard cells arranged in a first direction, the cell rows being arranged in a second direction vertical to the first direction; a plurality of metal power lines formed in a first metal interconnect layer, extending in the first direction, placed at a first given spacing in the second direction, and supplying a first power supply voltage to the standard cells; a local power line formed in a local interconnect layer in which local interconnects in contact with sources and drains of transistors included in the standard cells are formed, extending in the second direction, and connected with the plurality of metal power lines; a buried power line formed in a buried interconnect layer, extending in the second direction, overlapping the local power line as viewed in plan, and connected with the local power line; and an upper-layer metal power line formed in a second metal interconnect layer located above the first metal interconnect layer, extending in the second direction, and overlapping the local power line as viewed in plan, wherein the local power line and the upper-layer metal power line are mutually connected in only cell rows on both ends of the plurality of cell rows in the second direction.

According to the above mode, a plurality of metal power lines extending in the first direction are placed at a given spacing in the second direction. A local power line extending in the second direction is connected with the plurality of metal power lines. A buried power line extending in the second direction overlaps the local power line as viewed in plan, and is connected with the local power line. An upper-layer metal power line extending in the second direction is formed in a metal interconnect layer located above the plurality of metal power lines, and is connected with the local power line in only cell rows on both ends in the second direction. With this configuration, having the mutually connected local power line and buried power line, power supply can be strengthened. Also, since the upper-layer metal power line is connected with the local power line in only cell rows on both ends in the second direction, a larger region for laying signal lines can be secured in the metal interconnect layer. As a result, reduction in the area of the semiconductor integrated circuit device can be achieved.

According to the present disclosure, higher integration and area reduction of a semiconductor integrated circuit device can be achieved by securing the region for laying signal lines in the power line structure for supplying power to standard cells.

BRIEF DESCRIPTION OF THE DRAWINGS

FIG. 1 shows a layout example of a circuit block of a semiconductor integrated circuit device according to the first embodiment.

FIGS. 2A and 2B are cross-sectional views of the circuit block of FIG. 1.

FIG. 3 is a plan view showing an example of the layout structure of a power tap cell.

FIGS. 4A and 4B are cross-sectional views of the power tap cell of FIG. 3.

FIGS. 6A and 6B are cross-sectional views of the inverter cell of FIG. 5.

FIGS. 7A and 7B are plan views showing layout structures of a VDD power tap cell and a VSS power tap cell, respectively, according to an alteration.

FIG. 9 shows a layout example of a circuit block according to another alteration.

FIGS. 10A and 10B are plan views showing layout structures of a VDD connection terminal cell and a VSS connection terminal cell, respectively.

FIG. 11 shows a layout example of a circuit block of a semiconductor integrated circuit device according to the second embodiment.

FIGS. 12A and 12B are cross-sectional views of the circuit block of FIG. 11.

DETAILED DESCRIPTION

Figure 5:
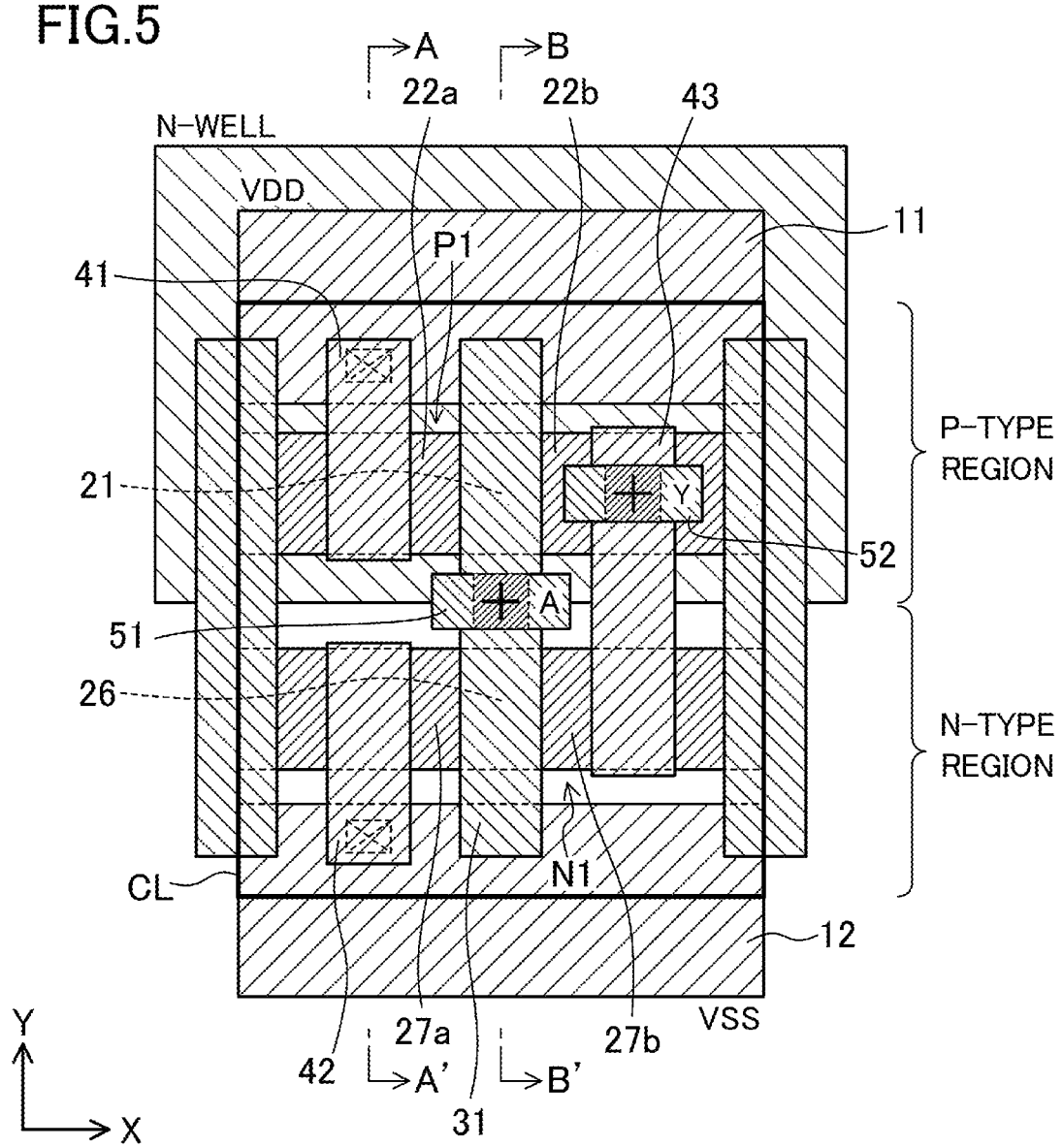
FIG. 5 is a plan view showing an example of the layout structure of an inverter cell.

Embodiments of the present disclosure will be described hereinafter with reference to the accompanying drawings. Note that, in the following embodiments, the semiconductor integrated circuit device includes a plurality of standard cells (hereinafter simply called cells as appropriate), and at least some of such standard cells include nanosheet field effect transistors (FETs), for example. The nanosheet FET is a FET using a thin sheet (nanosheet) through which a current flows. The nanosheet is formed of silicon, for example. Also, in the present disclosure, a semiconductor layer portion formed on each end of a nanosheet to constitute a terminal that is to be the source or drain of a nanosheet FET is called a "pad."

In the present disclosure, "VDD" and "VSS" indicate the power supply voltages or the power supplies themselves. Also, in the plan views such as FIG. 1, the horizontal direction is called an X direction (corresponding to the first direction), the vertical direction is called a Y direction (corresponding to the second direction), and the direction perpendicular to the substrate plane is called a Z direction.

First Embodiment

FIG. 1 shows a layout example of a circuit block of a semiconductor integrated circuit device according to the first embodiment, FIG. 2A is a cross-sectional view taken along line A-A' in FIG. 1, and FIG. 2B is a cross-sectional view taken along line B-B' in FIG. 1. In the layout of FIG. 1, a plurality of cell rows CR each including standard cells C arranged in the X direction are arranged in the Y direction. Each of the standard cells includes a nanosheet FET, for example. The cell rows CR are inverted vertically (in the Y direction) every other row. Power lines 3 supplying the power supply voltage VDD and power lines 4 supplying the power supply voltage VSS are placed alternately between the adjacent cell rows CR. The power lines 3 and 4 are buried power rails (BPRs) formed in a buried interconnect layer. The cells C in the cell rows CR receive VDD and VSS from the power lines 3 and 4 placed on their upper and lower sides in the figure.

In the cell rows CR, power tap cell groups 2a, 2b, and 2c each including a plurality of power tap cells 1 are disposed at equal spacing in the X direction. Each of the power tap cell groups 2a, 2b, and 2c includes a plurality of power tap cells 1 located at the same position in the X direction.

Local interconnects extending in the Y direction are formed in the power tap cells 1. The local interconnects are formed in a local interconnect layer that is in contact with the sources and drains of transistors in the standard cells C. In each of the power tap cell groups 2a, 2b, and 2c, with continuous adjacent placement of the power tap cells 1, formed are local power lines 5 and 6 extending in the Y direction in the circuit block. The local power line 5 is connected with the power lines 3 supplying VDD through vias in the power tap cells 1. The local power line 6 is connected with the power lines 4 supplying VSS through vias in the power tap cells 1.

Metal power lines 7 and 8 extending in the X direction are formed in an M4 interconnect layer (the fourth metal interconnect layer from the substrate). The metal power lines 7 are connected with the local power lines 5 through M1 to M3 interconnects and vias. The metal power lines 8 are connected with the local power lines 6 through M1 to M3 interconnects and vias. That is, VDD is supplied from the metal power lines 7 to the power lines 3 through the local power lines 5, and VSS is supplied from the metal power lines 8 to the power lines 4 through the local power lines 6.

FIG. 3 is a plan view showing an example of the layout structure of the power tap cell 1. FIGS. 4A and 4B are cross-sectional views taken vertically as viewed in plan, showing cross sections taken along line A-A' and line B-B' in FIG. 3, respectively. In FIG. 3, CL represents the bounds of the power tap cell, which also applies to the subsequent plan views. FIG. 5 is a plan view showing an example of the layout structure of an inverter cell as an example of the cells C. FIGS. 6A and 6B are cross-sectional views taken vertically as viewed in plan, showing cross sections taken along line A-A' and line B-B' in FIG. 5, respectively.

First, referring to FIGS. 5, 6A, and 6B, the layout structure of the inverter cell will be described.

As shown in FIG. 5, power lines 11 and 12 extending in the X direction are provided on both ends of the inverter cell in the Y direction. The power lines 11 and 12 are both buried power rails (BPRs) formed in the buried interconnect layer. The power line 11 supplies the power supply voltage VDD, and the power line 12 supplies the power supply voltage VSS. The power line 11 is shared by other cells C arranged in the same cell row CR as this inverter cell, forming the power line 3 in FIG. 1. The power line 12 is shared by other cells C arranged in the same cell row CR as this inverter cell, forming the power line 4 in FIG. 1.

A p-type transistor P1 is formed in a p-type region on an N-well, and an n-type transistor N1 is formed in an n-type region on a P-substrate.

The transistor P1 has two nanosheets 21 as a channel portion. That is, the transistor P1 is a nanosheet FET. At both ends of the nanosheets 21 in the X direction, formed are pads 22a and 22b each formed of an integral semiconductor layer connected to the two sheets. The pads 22a and 22b are to be the source region and drain region of the transistor P1.

The transistor N1 has two nanosheets 26 as a channel portion. That is, the transistor N1 is a nanosheet FET. At both ends of the nanosheets 26 in the X direction, formed are pads 27a and 27b each formed of an integral semiconductor layer connected to the two sheets. The pads 27a and 27b are to be the source region and drain region of the transistor N1.

A gate interconnect 31, extending in the Y direction, surrounds the nanosheets 21 of the transistor P1 through a gate insulating film (not shown) and also surrounds the nanosheets 26 of the transistor N1 through a gate insulating film (not shown). The gate interconnect 31 is to be the gates of the transistors P1 and N1.

Local interconnects (abbreviated as LI in the FIGS. 41, 42, and 43 extending in the Y direction are formed. The local interconnect 41 is connected with the pad 22a and also connected with the power line 11 through a via. The local interconnect 42 is connected with the pad 27a and also connected with the power line 12 through a via. The local interconnect 43 is connected with the pads 22b and 27b.

M1 interconnects 51 and 52 extending in the X direction are formed in a first metal interconnect layer. The M1 interconnect 51 is connected with the gate interconnect 31 through a via, and an input terminal A is provided on the top of the M1 interconnect 51. The M1 interconnect 52 is connected with the local interconnect 43 through a via, and an output terminal Y is provided on the top the M1 interconnect 52.

That is, the local interconnects 41, 42, and 43 are formed in the local interconnect layer located above the buried power lines and below the M1 interconnects, and are in contact with the sources or drains of the transistors P1 and N1. Also, the cell terminals are provided in the M1 interconnect layer, and interconnects between cells are provided in the M1 and upper interconnect layers.

Next, the layout structure of the power tap cell 1 will be described with reference to FIGS. 3, 4A, and 4B.

As shown in FIG. 3, as in the inverter cell, the power lines 11 and 12 extending in the X direction, which are both buried power rails, are provided on both ends of the power tap cell 1 in the Y direction. The power line 11 supplies the power supply voltage VDD, and the power line 12 supplies the power supply voltage VSS.

No nanosheets are formed, and thus no transistors are formed, in the power tap cell 1.

A gate interconnect 35 extends in the Y direction, and local interconnects 46 and 47 extending in the Y direction are formed on both sides of the gate interconnect 35 in the X direction. The local interconnects 46 and 47 are formed in the same local interconnect layer as the local interconnects 41, 42, and 43 of the inverter cell. The local interconnects 46 and 47 extend up to the cell bounds CL in the Y direction. The local interconnect 46 is connected with the power line 11 through a via, and the local interconnect 47 is connected with the power line 12 through a via.

The power tap cells 1 like the one shown in FIGS. 3, 4A, and 4B are placed in line in the Y direction as shown in FIG. 1. With this placement, the local interconnects 46 and 47 each continue over the power tap cells 1 lying in line in the Y direction, forming the local power lines 5 and 6 in FIG. 1. Since the local interconnect 46 is connected with the power line 11 through a via and the local interconnect 47 is connected with the power line 12 through a via in each power tap cell 1, the local power line 5 is to be connected with the power lines 3 and the local power line 6 is to be connected with the power lines 4.

In the configuration of FIG. 1, the spacing of the metal power lines 7 supplying VDD in the Y direction is greater than the spacing of the buried power lines 3 supplying VDD in the Y direction. Also, the spacing of the metal power lines 8 supplying VSS in the Y direction is greater than the spacing of the buried power lines 4 supplying VSS in the Y direction.

According to this embodiment, power can be supplied from the upper-layer metal power lines 7 and 8 to the power lines 3 and 4 that are buried power rails through the local power lines 5 and 6 extending in the Y direction, respectively. This eliminates the necessity of providing metal power lines for the individual buried power lines 3 and 4 in the M1 and upper interconnect layers. Therefore, in the M1 and upper interconnect layers, a larger number of metal interconnects can be used as signal lines. As a result, the area of the semiconductor integrated circuit device can be reduced.

Also, since the power tap cell groups 2a, 2b, and 2c are disposed at equal spacing in the X direction, the power supply from the upper-layer power lines to the power lines 3 and 4 can be made uniform in the circuit block. Therefore, power supply voltage drops can be effectively controlled.

While the metal power lines 7 and 8 extending in the X direction are formed in the M4 interconnect layer in the configuration described above, the upper-layer metal power lines extending in the X direction may be formed in an interconnect layer other than the M4 interconnect layer. Also, while the metal power lines 7 and 8 are connected with the local power lines 5 and 6 through the M1 to M3 interconnects and vias, contacts (super-vias) directly connecting the M4 interconnects and the local interconnects, for example, may be used instead.

In the configuration described above, power lines may be further provided in an interconnect layer above the M4 interconnect layer. By connecting such power lines to the metal power lines 7 and 8 formed in the M4 interconnect layer, power supply can be strengthened.

Alteration 1

The power tap cell shown in FIGS. 3, 4A, and 4B has a layout structure of supplying both VDD and VSS. It is however acceptable for the power tap cell to have a structure of supplying either one of VDD and VSS.

FIGS. 7A and 7B are plan views showing layout structures of power tap cells according to an alteration, in which FIG. 7A shows a power tap cell supplying the power supply voltage VDD and FIG. 7B shows a power tap cell supplying the power supply voltage VSS.

In FIG. 7A, both local interconnects 46a and 46b are connected with the power line 11 through vias. In FIG. 7B, both local interconnects 47a and 47b are connected with the power line 12 through vias.

Figure 8:
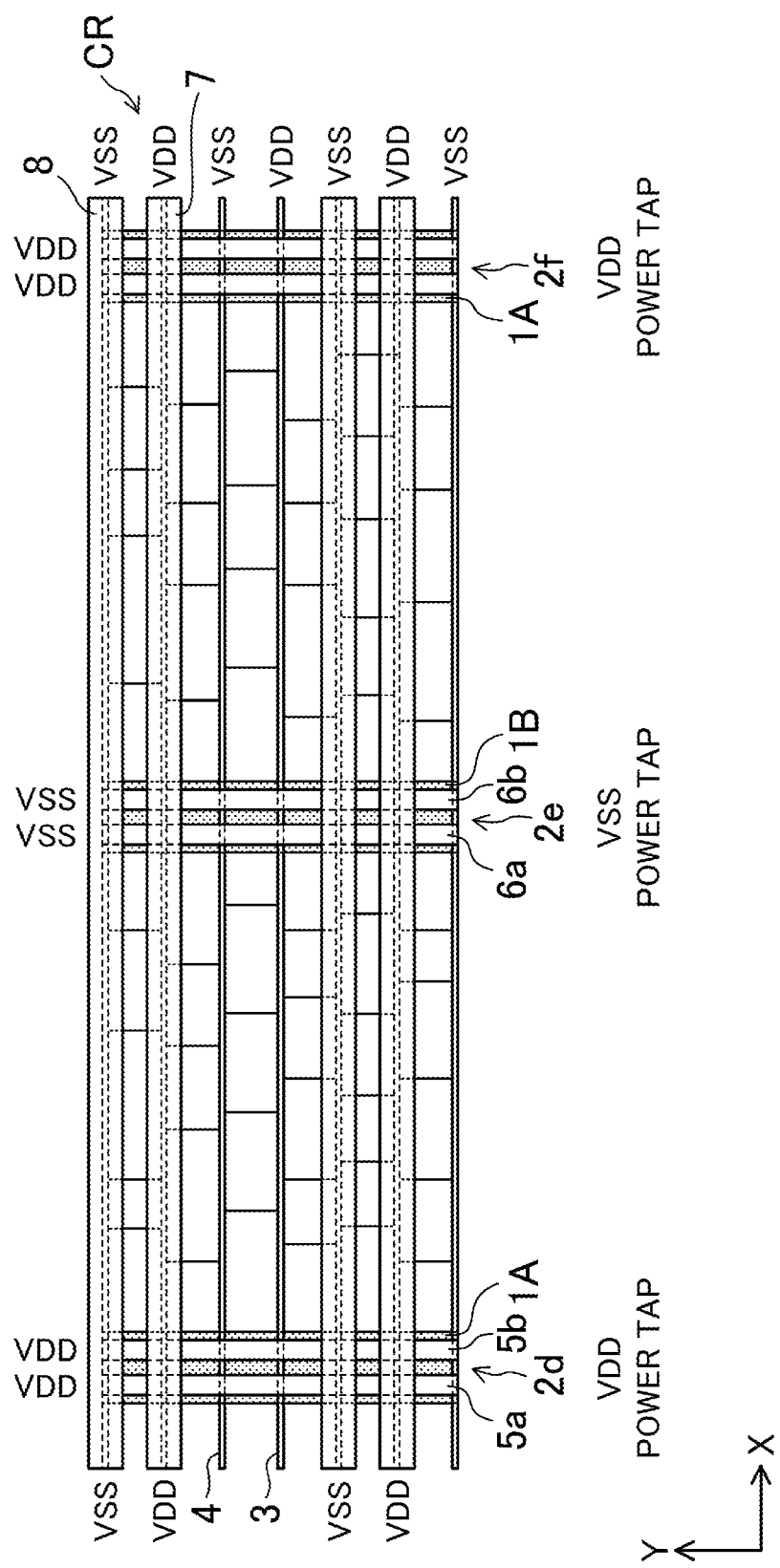
FIG. 8 shows a layout example of a circuit block according to the alteration.

FIG. 8 shows a layout example of a circuit block according to the alteration. In the layout of FIG. 8, power tap cell groups 2d and 2f each including power tap cells 1A supplying VDD, like the one shown in FIG. 7A, and a power tap cell group 2e including power tap cells 1B supplying VSS, like the one shown in FIG. 7B, are placed alternately in the X direction.

In the power tap cell groups 2d and 2f, the local interconnects 46a and 46b each continue over the power tap cells 1A lying in line in the Y direction, forming local power lines 5a and 5b in FIG. 8. Since the local interconnects 46a and 46b are connected with the power line 11 through vias in each power tap cell 1A, the local power lines 5a and 5b are to be connected with the power lines 3.

In the power tap cell group 2e, the local interconnects 47a and 47b each continue over the power tap cells 1B lying in line in the Y direction, forming local power lines 6a and 6b in FIG. 8. Since the local interconnects 47a and 47b are connected with the power line 12 through vias in each power tap cell 1B, the local power lines 6a and 6b are to be connected with the power lines 4.

In this alteration, also, similar effects to those in the above embodiment are obtained. That is, power can be supplied from the upper-layer metal power lines 7 to the buried power lines 3 through the local power lines 5a and 5b extending in the Y direction. Also, power can be supplied from the upper-layer metal power lines 8 to the buried power lines 4 through the local power lines 6a and 6b extending in the Y direction. This eliminates the necessity of providing metal power lines for the individual buried power lines 3 and 4 in the M1 and upper interconnect layers. Therefore, in the M1 and upper interconnect layers, a larger number of metal interconnects can be used as signal lines. As a result, the area of the semiconductor integrated circuit device can be reduced.

Alteration 2

FIG. 9 shows a layout example of a circuit block according to an alteration. In the layout of FIG. 9, cells terminating the power lines 3 and 4 are placed along both ends in the X direction. That is, VDD connection terminal cells 9A each terminating the power line 3 are placed in line in the Y direction along the left end in the figure, and VSS connection terminal cells 9B each terminating the power line 4 are placed in line in the Y direction along the right end in the figure. As in the other standard cells C, the VDD connection terminal cells 9A and the VSS connection terminal cells 9B are inverted vertically every other row.

FIGS. 10A and 10B are plan views showing layout structures of the VDD connection terminal cell 9A and the VSS connection terminal cell 9B, respectively. In FIG. 10A, provided are a power line 11A that is a buried power rail extending in the X direction and further a buried power line 13 extending in the Y direction. The power line 11A does not reach an end of the VDD connection terminal cell 9A in the X direction (the left end in FIG. 10A).

In FIG. 10B, provided are a power line 12A that is a buried power rail extending in the X direction and further a buried power line 14 extending in the Y direction. The power line 12A does not reach an end of the VSS connection terminal cell 9B in the X direction (the right end in FIG. 10B).

By placing the VDD connection terminal cells 9A like the one of FIG. 10A in line in the Y direction along the left end of the circuit block of FIG. 9, the power lines 3 supplying VDD are mutually connected through the buried power lines 13. By placing the VSS connection terminal cells 9B like the one of FIG. 10B in line in the Y direction along the right end of the circuit block of FIG. 9, the power lines 4 supplying VSS are mutually connected through the buried power lines 14.

According to this alteration, therefore, power supply can be strengthened without use of interconnects in the upper-layer interconnect layers.

While the VDD connection terminal cells are placed along the left end of the circuit block and the VSS connection terminal cells are placed along the right end of the circuit block as viewed in the figure in this alteration, the placement of the cells terminating the power lines 3 and 4 is not limited to this. For example, VDD connection terminal cells may be placed along both ends of the circuit block, or VSS connection terminal cells may be placed along both ends of the circuit block. Otherwise, cells terminating the power lines 3 and 4 may be inserted midway of the cell rows.

Second Embodiment

FIG. 11 shows a layout example of a circuit block of a semiconductor integrated circuit device according to the second embodiment. FIG. 12A is a cross-sectional view taken along line A-A' in FIG. 11, and FIG. 12B is a cross-sectional view taken along line B-B' in FIG. 11. In the layout of FIG. 11, a plurality of cell rows CR each including standard cells C arranged in the X direction are arranged in the Y direction. Each of the standard cells C includes a nanosheet FET, for example. The cell rows CR are inverted vertically (in the Y direction) every other row. Power lines 3 supplying the power supply voltage VDD and power lines 4 supplying the power supply voltage VSS are placed alternately between the adjacent cell rows CR. The power lines 3 and 4 are buried power rails (BPRs) formed in a buried interconnect layer. The cells C in the cell rows CR receive VDD and VSS from the power lines 3 and 4 placed on their upper and lower sides in the figure.

In the cell rows CR, power tap cell groups 2a, 2b, and 2c each including a plurality of power tap cells 1 are disposed at equal spacing in the X direction. Each of the power tap cell groups 2a, 2b, and 2c includes a plurality of power tap cells 1 located at the same position in the X direction.

Local interconnects extending in the Y direction are formed in the power tap cells 1. In each of the power tap cell groups 2a, 2b, and 2c, with continuous adjacent placement of the power tap cells 1 in the Y direction, formed are local power lines 5 and 6 extending in the Y direction in the circuit block. The local power line 5 is connected with the power lines 3 supplying VDD through vias in the power tap cells 1. The local power line 6 is connected with the power lines 4 supplying VSS through vias in the power tap cells 1. The configuration so far is similar to the layout of FIG. 1 in the first embodiment.

In this embodiment, metal power lines 107 and 108 extending in the Y direction are formed in an M3 interconnect layer (the third metal interconnect layer from the substrate). The metal power lines 107 are connected with the local power lines 5 through M1 and M2 interconnects and vias. The metal power lines 108 are connected with the local power lines 6 through M1 and M2 interconnects and vias. That is, VDD is supplied from the metal power lines 107 to the power lines 3 through the local power lines 5, and VSS is supplied from the metal power lines 108 to the power lines 4 through the local power lines 6.

A configuration including M1 and M2 interconnects and vias for connecting a metal power line and a local power line is herein called a connecting portion. In FIG. 11, each position where such a connecting portion is provided is indicated by the dashed line A1. Connecting portions 111 and 112 for connecting the metal power line 107 and the local power line 5 supplying VDD are provided at a given spacing. The spacing of the connecting portions 111 and 112 is greater than the spacing of the power lines 3 supplying VDD. Also, connecting portions 121 and 122 for connecting the metal power line 108 and the local power line 6 supplying VSS are provided at a given spacing. The spacing of the connecting portions 121 and 122 is greater than the spacing of the power lines 4 supplying VSS.

Moreover, the connecting portions 111 and 112 for connecting the metal power line 107 and the local power line 5 supplying VDD and the connecting portions 121 and 122 for connecting the metal power line 108 and the local power line 6 supplying VSS are aligned at the same position in the Y direction.

According to this embodiment, power can be supplied from the upper-layer metal power lines 107 and 108 to the power lines 3 and 4 that are buried power rails through the local power lines 5 and 6 extending in the Y direction, respectively. This eliminates the necessity of providing metal power lines for the individual buried power lines 3 and 4 in the M1 and upper interconnect layers. Therefore, in the M1 and upper interconnect layers, a larger number of metal interconnects can be used as signal lines. As a result, the area of the semiconductor integrated circuit device can be reduced.

Also, since the power tap cell groups 2a, 2b, and 2c are disposed at equal spacing in the X direction, the power supply from the upper-layer power lines to the power lines 3 and 4 can be made uniform in the circuit block. Therefore, power supply voltage drops can be effectively controlled.

In the configuration described above, the VDD connecting portions 111 and 112 and the VSS connecting portions 121 and 122 are aligned in the Y direction. This reduces the range in which laying of signal lines is unavailable in the Y direction due to the presence of the connecting portions, whereby a larger region for laying signal lines can be secured. As a result, reduction in the area of the semiconductor integrated circuit device can be achieved.

It is not necessarily required to align the positions of the VDD connecting portions and the VSS connecting portions in the Y direction.

While the metal power lines 107 and 108 extending in the Y direction are formed in the M3 interconnect layer in the configuration described above, the upper-layer metal power lines extending in the Y direction may be formed in an interconnect layer other than the M3 interconnect layer. Also, while the metal power lines 107 and 108 are connected with the local power lines 5 and 6 through the M1 and M2 interconnects and vias, contacts (super-vias) directly connecting the M3 interconnects and the local interconnects, for example, may be used instead.

In the configuration described above, power lines may be further provided in an interconnect layer above the M3 interconnect layer. By connecting such power lines to the metal power lines 107 and 108 formed in the M3 interconnect layer, power supply can be strengthened.

Third Embodiment

Figure 13:
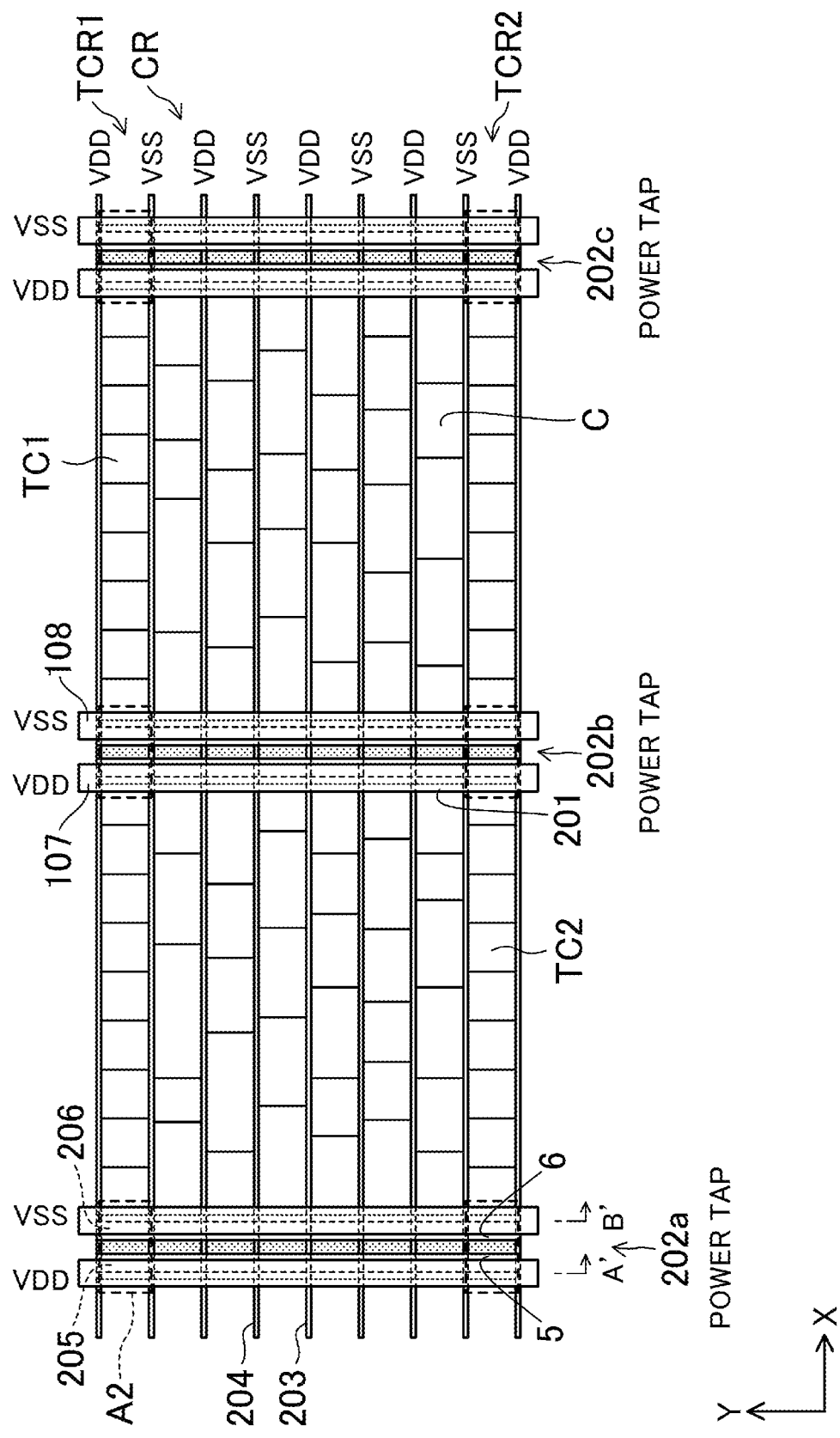
FIG. 13 shows a layout example of a circuit block of a semiconductor integrated circuit device according to the third embodiment.
Figure 14A:
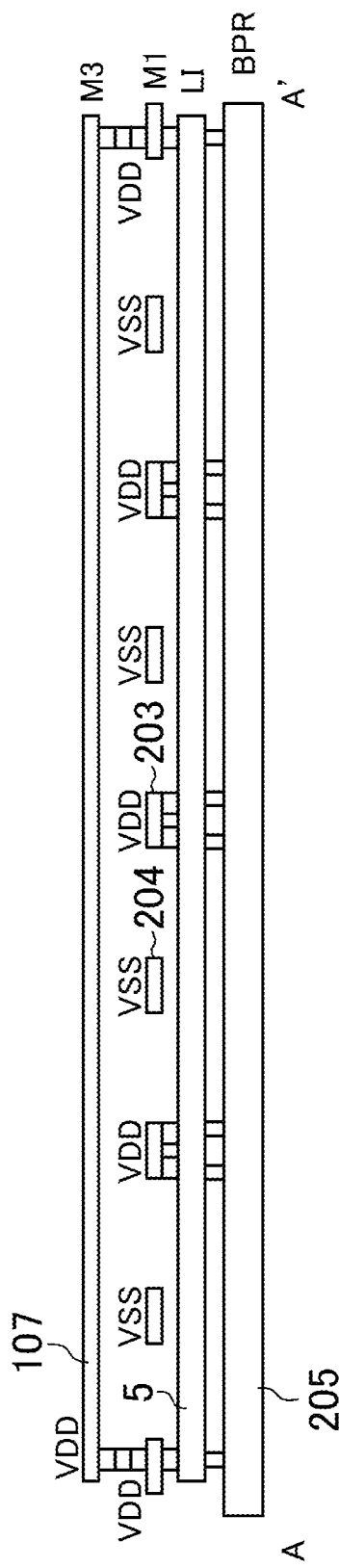
FIGS. 14A and 14B are cross-sectional views of the circuit block of FIG. 13.
Figure 14B:
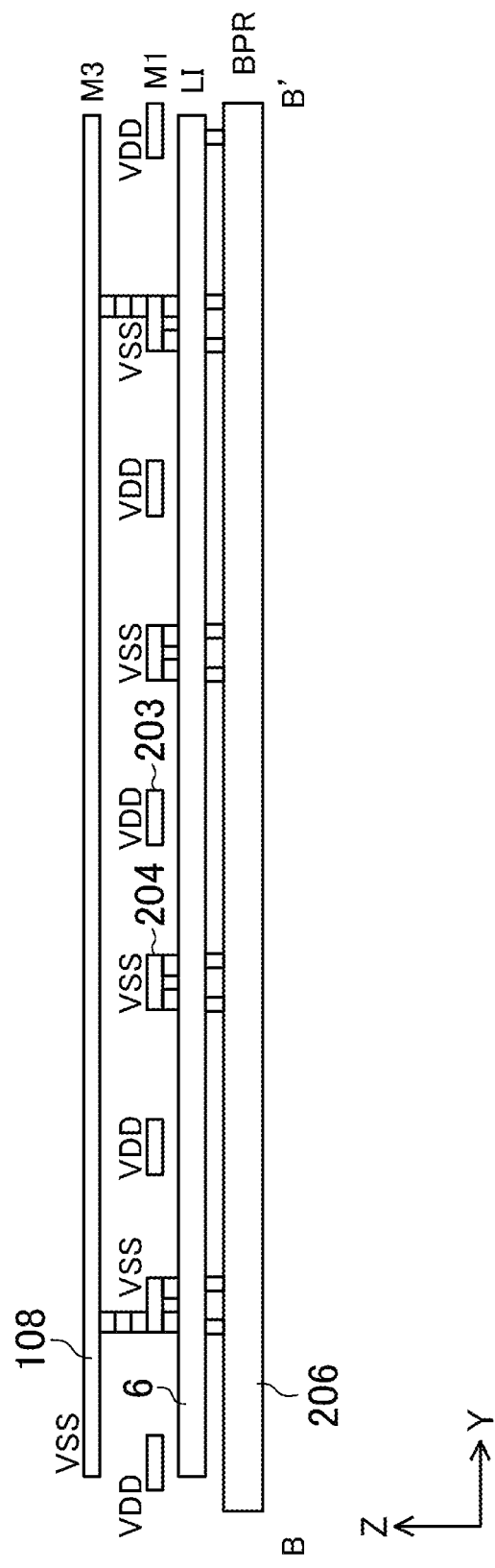

FIG. 13 shows a layout example of a circuit block of a semiconductor integrated circuit device according to the third embodiment. FIG. 14A is a cross-sectional view taken along line A-A' in FIG. 13, and FIG. 14B is a cross-sectional view taken along line B-B' in FIG. 13. In the layout of FIG. 13, a plurality of cell rows CR each including standard cells C arranged in the X direction are arranged in the Y direction. Each of the standard cells C includes a nanosheet FET, for example. The cell rows CR are inverted vertically (in the Y direction) every other row.

A terminal cell row TCR1 including terminal cells TC1 arranged in the X direction is placed on the upper end of the circuit block in the figure, and a terminal cell row TCR2 including terminal cells TC2 arranged in the X direction is placed on the lower end of the circuit block in the figure. The terminal cells TC1 and TC2 are the same in size in the X direction, i.e., cell width.

Power lines 203 supplying the power supply voltage VDD and power lines 204 supplying the power supply voltage VSS are placed alternately between the adjacent cell rows CR and terminal cell rows TCR1 and TCR2. Unlike the first and second embodiments, the power lines 203 and 204 are formed in an M1 interconnect layer. The cells C in the cell rows CR receive VDD and VSS from the power lines 203 and 204 placed on both sides in the Y direction in the figure.

In the cell rows CR and the terminal cell rows TCR1 and TCR2, power tap cell groups 202a, 202b, and 202c each including a plurality of power tap cells 201 are disposed at equal spacing in the X direction. Each of the power tap cell groups 202a, 202b, and 202c includes a plurality of power tap cells 201 located at the same position in the X direction.

Buried interconnects and local interconnects extending in the Y direction are formed in the power tap cells 201. In each of the power tap cell groups 202a, 202b, and 202c, with continuous adjacent placement of the power tap cells 201 in the Y direction, formed are buried power lines 205 and 206 and local power lines 5 and 6, both extending in the Y direction in the circuit block. The buried power line 205 and the local power line 5 are connected with the power lines 203 supplying VDD through vias in the power tap cells 201. The buried power line 206 and the local power line 6 are connected with the power lines 204 supplying VSS through vias in the power tap cells 201.

Metal power lines 107 and 108 extending in the Y direction are formed in an M3 interconnect layer (the third metal interconnect layer from the substrate). The metal power lines 107 are connected with the local power lines 5 and the buried power lines 205 through M1 and M2 interconnects and vias in the power tap cells 201 placed in the terminal cell rows TCR1 and TCR2. The metal power lines 108 are connected with the local power lines 6 and the buried power lines 206 through M1 and M2 interconnects and vias in the power tap cells 201 placed in the terminal cell rows TCR1 and TCR2. That is, VDD is supplied from the metal power lines 107 to the power lines 203 through the local power lines 5 and the buried power lines 205, and VSS is supplied from the metal power lines 108 to the power lines 204 through the local power lines 6 and the buried power lines 206. In FIG. 13, each position where the metal power line 107 is connected with the local power line 5 and the buried power line 205 and where the metal power line 108 is connected with the local power line 6 and the buried power line 206 is indicated by the dashed line A2.

Figure 15B:
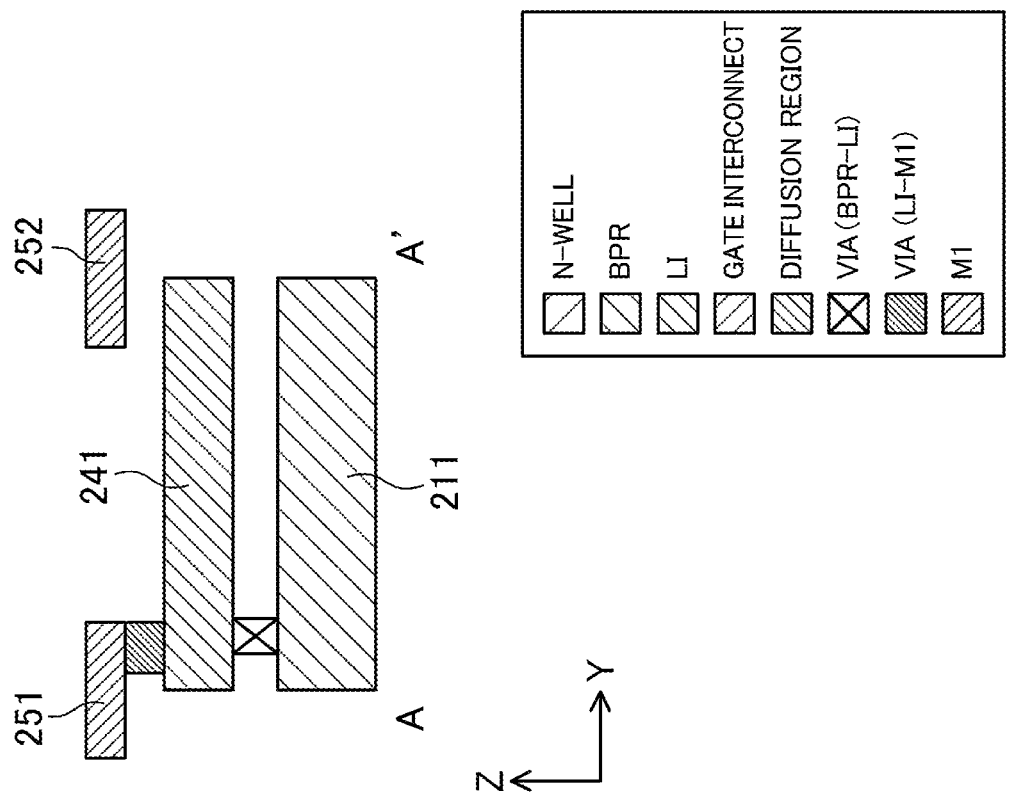
FIGS. 15A and 15B are a plan view and a cross-sectional view, respectively, showing an example of the layout structure of a power tap cell.
Figure 15A:
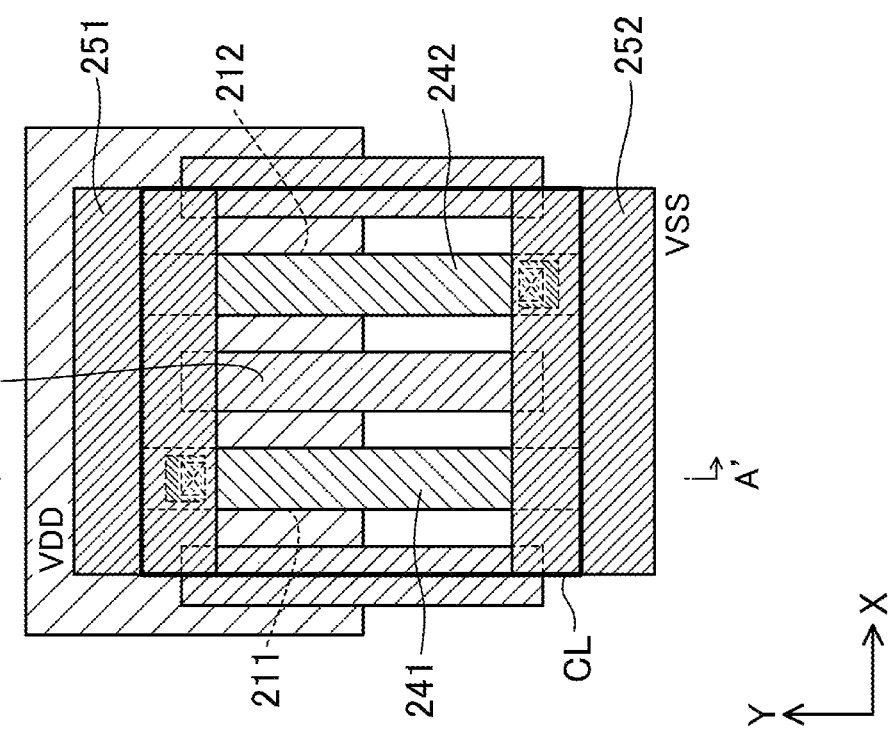

FIGS. 15A and 15B are a plan view and a cross-sectional view, respectively, showing an example of the layout structure of the power tap cell 201. M1 interconnects 251 and 252 extending in the X direction are provided on both ends of the power tap cell 201 in the Y direction. The M1 interconnect 251 supplies the power supply voltage VDD, and the M1 interconnect 252 supplies the power supply voltage VSS. The M1 interconnect 251 is shared by other cells C arranged in the same cell row CR as this power tap cell 201 or shared by terminal cells TC1 or TC2 arranged in the same terminal cell row TCR1 or TCR2 as this power tap cell 201, forming the power line 203 in FIG. 13. The M1 interconnect 252 is shared by other cells C arranged in the same cell row CR as this power tap cell 201 or by terminal cells TC1 or TC2 arranged in the same terminal cell row TCR1 or TCR2 as this power tap cell 201, forming the power line 204 in FIG. 13.

A gate interconnect 231 extends in the Y direction, and local interconnects 241 and 242 extending in the Y direction are formed on both sides of the gate interconnect 231 in the X direction. The local interconnects 241 and 242 extend up to the cell bounds CL in the Y direction. Also, in the buried interconnect layer, formed are buried power lines 211 and 212 extending in the Y direction to overlap the local interconnects 241 and 242, respectively, as viewed in plan. The buried power lines 211 and 212 extend up to the cell bounds CL in the Y direction. The local interconnect 241 and the buried power line 211 are connected through a via, and the local interconnect 242 and the buried power line 212 are connected through a via.

The local interconnect 241 is connected with the M1 interconnect 251 through a via, and the local interconnect 242 is connected with the M1 interconnect 252 through a via.

The power tap cells 201 like the one shown in FIG. 15 are placed in line in the Y direction as shown in FIG. 13. With this placement, the buried power lines 211 and 212 each continue over the power tap cells 201 lying in line in the Y direction, forming the buried power lines 205 and 206 in FIG. 13. Also, the local interconnects 241 and 242 each continue over the power tap cells 201 lying in line in the Y direction, forming the local power lines 5 and 6 in FIG. 13. Since the local interconnect 241 is connected with the M1 interconnect 251 through a via and the local interconnect 242 is connected with the M1 interconnect 252 through a via in each power tap cell 201, the local power line 5 is to be connected with the power lines 203 and the local power line 6 is to be connected with the power lines 204.

According to this embodiment, the local power lines 5 and 6 extending in the Y direction are respectively connected with the metal power lines 203 and 204 extending in the X direction. The buried power lines 205 and 206 extending in the Y direction overlap the local power lines 5 and 6 as viewed in plan and are connected with the local power lines 5 and 6, respectively. The upper-layer metal power lines 107 and 108 extending in the Y direction are formed in a metal interconnect layer located above the metal power lines 203 and 204, and are connected with the local power lines 5 and 6, respectively. With this configuration, having the mutually connected local power lines 5 and 6 and buried power lines 205 and 206, power supply can be strengthened. Also, since the upper-layer metal power lines 107 and 108 are connected with the local power lines 5 and 6 at only the cell rows on both ends in the Y direction, a larger region for laying signal lines can be secured in the metal interconnect layer. As a result, reduction in the area of the semiconductor integrated circuit device can be achieved.

In the terminal cell rows TCR1 and TCR2, logical cells may also be placed.

While the metal power lines 107 and 108 extending in the Y direction are formed in the M3 interconnect layer in the configuration described above, the upper-layer metal power lines extending in the Y direction may be formed in an interconnect layer other than the M3 interconnect layer. Also, while the metal power lines 107 and 108 are connected with the local power lines 5 and 6 through the M1 and M2 interconnects and vias, contacts (super-vias) directly connecting the M3 interconnects and the local interconnects, for example, may be used instead.

In the configuration described above, power lines may be further provided in an interconnect layer above the M3 interconnect layer. By connecting such power lines to the metal power lines 107 and 108 formed in the M3 interconnect layer, power supply can be strengthened.

Other Embodiments

In the above embodiments, it is not necessarily required to place the power tap cell groups at equal spacing in the X direction. For example, power tap cell groups may be placed at a narrower spacing in a region where more strengthened power supply is desired than in other regions. That is, power tap cell groups may be placed at a given spacing in the X direction.

While the transistors in the cells C are nanosheet FETs in the above embodiments, the configuration is not limited to this, but may be fin transistors, for example. Also, while each nanosheet FET in the cells C has two nanosheets in the above embodiments, the number of nanosheets is not limited to two.

The width (size in the X direction) of each power tap cell is not limited to the one described in the above embodiments. For example, in FIG. 3, the width of the power tap cell may be made large enough to place two local interconnects supplying VDD and two local interconnects supplying VSS. Also, in FIGS. 7A and 7B, only one local interconnect may be placed to reduce the width of the power tap cell, or three or more local interconnects may be placed in parallel to increase the width of the power tap cell.

According to the present disclosure, a larger region for laying signal lines can be secured in the power line structure. The present disclosure is therefore useful for downsizing of semiconductor chips, for example.

What is claimed is:

1. A semiconductor integrated circuit device, comprising:
a plurality of cell rows each including standard cells arranged in a first direction, the cell rows being arranged in a second direction vertical to the first direction;
a plurality of buried power lines formed in a buried interconnect layer, extending in the first direction, placed at a first given spacing in the second direction, and supplying a first power supply voltage to the standard cells;
a local power line formed in a local interconnect layer in which local interconnects in contact with sources and drains of transistors included in the standard cells are formed, extending in the second direction, and connected with the plurality of buried power lines; and
a plurality of metal power lines formed in a metal interconnect layer located above the local interconnect layer, extending in the first direction, placed at a second given spacing greater than the first given spacing in the second direction, and connected with the local power line.

2. The semiconductor integrated circuit device of claim 1, further comprising:
a power tap cell group including a plurality of power tap cells arranged in the second direction, each of the power tap cells being provided in each of the plurality of cell rows,
wherein
the plurality of power tap cells each include a local interconnect extending in the second direction, and
the local power line is formed by continuous placement of the local interconnects of the plurality of power tap cells.

3. The semiconductor integrated circuit device of claim 2, wherein
the power tap cell group is placed at a plurality of positions equally spaced in the first direction.

4. The semiconductor integrated circuit device of claim 1, further comprising:
a plurality of second buried power lines formed in the buried interconnect layer, extending in the first direction, placed at a third given spacing in the second direction, and supplying a second power supply voltage to the standard cells;
a second local power line formed in the local interconnect layer, extending in the second direction, and connected with the plurality of second buried power lines; and
a plurality of second metal power lines formed in the metal interconnect layer, extending in the first direction, placed at a fourth given spacing greater than the third given spacing in the second direction, and connected with the second local power line.

5. The semiconductor integrated circuit device of claim 4, further comprising:
a power tap cell group including a plurality of power tap cells arranged in the second direction, each of the power tap cells being provided in each of the plurality of cell rows,
wherein
the plurality of power tap cells each include first and second local interconnects extending in parallel in the second direction, and
the local power line is formed by continuous placement of the first local interconnects of the plurality of power tap cells, and the second local power line is formed by continuous placement of the second local interconnects of the plurality of power tap cells.

6. The semiconductor integrated circuit device of claim 4, further comprising:
a first power tap cell group including a plurality of first power tap cells arranged in the second direction, each of the first power tap cells being provided in each of the plurality of cell rows; and
a second power tap cell group including a plurality of second power tap cells arranged in the second direction, each of the second power tap cells being provided in each of the plurality of cell rows,
wherein
the plurality of first power tap cells each include a first local interconnect extending in the second direction,
the plurality of second power tap cells each include a second local interconnect extending in the second direction, and
the local power line is formed by continuous placement of the first local interconnects of the plurality of first power tap cells, and the second local power line is formed by continuous placement of the second local interconnects of the plurality of second power tap cells.

7. The semiconductor integrated circuit device of claim 1, further comprising:
a plurality of power terminal cells arranged in the second direction at one end of the plurality of cell rows in the first direction, and
the plurality of power terminal cells each include a buried interconnect extending in the second direction for mutually connecting the plurality of buried power lines.

8. A semiconductor integrated circuit device, comprising:
a plurality of cell rows each including standard cells arranged in a first direction, the cell rows being arranged in a second direction vertical to the first direction;
a plurality of buried power lines formed in a buried interconnect layer, extending in the first direction, placed at a first given spacing in the second direction, and supplying a first power supply voltage to the standard cells;
a local power line formed in a local interconnect layer in which local interconnects in contact with sources and drains of transistors included in the standard cells are formed, extending in the second direction, and connected with the plurality of buried power lines; and
a metal power line formed in a metal interconnect layer located above the local interconnect layer, extending in the second direction, and overlapping the local power line as viewed in plan,
wherein
the local power line and the metal power line are mutually connected by a plurality of connecting portions provided at a second given spacing greater than the first given spacing in the second direction.

9. The semiconductor integrated circuit device of claim 8, further comprising:
a plurality of second buried power lines formed in the buried interconnect layer, extending in the first direction, placed at a third given spacing in the second direction, and supplying a second power supply voltage to the standard cells;
a second local power line formed in the local interconnect layer, extending in the second direction, and connected with the plurality of second buried power lines; and a second metal power line formed in the metal interconnect layer, extending in the second direction, and overlapping the second local power line as viewed in plan,
wherein
the second local power line and the second metal power line are mutually connected by a plurality of second connecting portions provided at a fourth given spacing greater than the third given spacing in the second direction.

10. The semiconductor integrated circuit device of claim 9, wherein
the plurality of connecting portions and the plurality of second connecting portions are placed at same positions in the second direction.

11. A semiconductor integrated circuit device, comprising:
a plurality of cell rows each including standard cells arranged in a first direction, the cell rows being arranged in a second direction vertical to the first direction;
a plurality of metal power lines formed in a first metal interconnect layer, extending in the first direction, placed at a first given spacing in the second direction, and supplying a first power supply voltage to the standard cells;
a local power line formed in a local interconnect layer in which local interconnects in contact with sources and drains of transistors included in the standard cells are formed, extending in the second direction, and connected with the plurality of metal power lines;
a buried power line formed in a buried interconnect layer, extending in the second direction, overlapping the local power line as viewed in plan, and connected with the local power line; and
an upper-layer metal power line formed in a second metal interconnect layer located above the first metal interconnect layer, extending in the second direction, and overlapping the local power line as viewed in plan,
wherein
the local power line and the upper-layer metal power line are mutually connected in only cell rows on both ends of the plurality of cell rows in the second direction.

12. The semiconductor integrated circuit device of claim 11, further comprising:
a power tap cell group including a plurality of power tap cells arranged in the second direction, each of the power tap cells being provided in each of the plurality of cell rows,
wherein
the plurality of power tap cells each include a local interconnect extending in the second direction and a buried interconnect overlapping the local interconnect, and
the local power line is formed by continuous placement of the local interconnects of the plurality of power tap cells, and the buried power line is formed by continuous placement of the buried interconnects of the plurality of power tap cells.

13. The semiconductor integrated circuit device of claim 12, wherein
the power tap cell group is placed at a plurality of positions equally spaced in the first direction.

14. The semiconductor integrated circuit device of claim 11, further comprising:
a plurality of second metal power lines formed in the first interconnect layer, extending in the first direction, placed at a third given spacing in the second direction, and supplying a second power supply voltage to the standard cells;
a second local power line formed in the local interconnect layer, extending in the second direction, and connected with the plurality of second metal power lines;
a second buried power line formed in the buried interconnect layer, extending in the second direction, overlapping the second local power line as viewed in plan, and connected with the second local power line; and
a second upper-layer metal power line formed in the second metal interconnect layer, extending in the second direction, and overlapping the second local power line as viewed in plan,
wherein
the second local power line and the second upper-layer metal power line are mutually connected in only cell rows on both ends of the plurality of cell rows in the second direction.

* * * * *